United States Patent
Lee et al.

(10) Patent No.: US 10,199,118 B2
(45) Date of Patent: Feb. 5, 2019

(54) ONE-TIME PROGRAMMABLE (OTP) MEMORY DEVICE FOR READING MULTIPLE FUSE BITS

(71) Applicant: SAMSUNG ELECTRONICS CO., LTD., Suwon-si, Gyeonggi-do (KR)

(72) Inventors: Sang-Seok Lee, Hwaseong-si (KR); Hyun-Taek Jung, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/657,494

(22) Filed: Jul. 24, 2017

(65) Prior Publication Data

US 2018/0108425 A1    Apr. 19, 2018

(30) Foreign Application Priority Data

Oct. 14, 2016    (KR) .................. 10-2016-0133563

(51) Int. Cl.
*G11C 17/16*    (2006.01)
*G11C 17/18*    (2006.01)
*G11C 7/20*    (2006.01)

(52) U.S. Cl.
CPC .............. *G11C 17/18* (2013.01); *G11C 7/20* (2013.01); *G11C 17/16* (2013.01)

(58) Field of Classification Search
CPC .................................................... G11C 17/16
USPC ......................................................... 365/96
See application file for complete search history.

(56) References Cited

U.S. PATENT DOCUMENTS

| | | | |
|---|---|---|---|
| 6,430,078 B1 | 8/2002 | Meier et al. | |
| 7,511,982 B2 | 3/2009 | Kurjanowicz et al. | |
| 7,710,788 B2 | 5/2010 | Jeon et al. | |
| 7,859,918 B1 | 12/2010 | Nguyen et al. | |
| 8,130,532 B2* | 3/2012 | Kurjanowicz | G11C 17/16 365/104 |
| 8,619,488 B2 | 12/2013 | Lin et al. | |
| 8,976,564 B2 | 3/2015 | Lim et al. | |
| 9,165,631 B2 | 10/2015 | Kim et al. | |
| 2003/0058728 A1* | 3/2003 | Tran | G11C 11/5621 365/230.03 |
| 2004/0151276 A1* | 8/2004 | Hoffmann | G11C 17/18 377/65 |
| 2009/0003093 A1* | 1/2009 | Matsuo | G11C 17/16 365/189.15 |
| 2014/0177313 A1* | 6/2014 | Lee | G11C 8/10 365/96 |
| 2015/0029778 A1 | 1/2015 | Yoon et al. | |

(Continued)

*Primary Examiner* — Min Huang
(74) *Attorney, Agent, or Firm* — Lee & Morse P.C.

(57) ABSTRACT

A one-time programmable (OTP) memory device includes an OTP cell array, a latch controller, a column selection circuit, and a latch circuit. The OTP cell array includes a plurality of OTP memory cells respectively connected to a plurality of bitlines. The latch controller generates a latch address signal indicating an address that is changed sequentially in an enable mode to initialize the OTP memory device. The column selection circuit electrically connects a plurality of bitline groups of the bitlines to a plurality of input-output lines sequentially based on the latch address signal in the enable mode. The latch circuit receives and stores fuse bits provided sequentially through the bitline groups and the input-output lines in the enable mode.

18 Claims, 19 Drawing Sheets

(56) References Cited

U.S. PATENT DOCUMENTS

| | | | |
|---|---|---|---|
| 2015/0074494 A1* | 3/2015 | Shim | G11C 29/787 |
| | | | 714/768 |
| 2015/0162094 A1* | 6/2015 | Kim | G11C 17/16 |
| | | | 365/96 |
| 2016/0042805 A1* | 2/2016 | Park | G11C 17/16 |
| | | | 365/96 |
| 2017/0242749 A1* | 8/2017 | Park | G11C 11/40611 |

* cited by examiner

| DATA | CLa | CLb |
|---|---|---|
| 1 | PROGRAMMED | UNPROGAMMED |
| 0 | UNPROGAMMED | PROGRAMMED |

| DATA | CLa | CLb |
|---|---|---|
| 1 | PROGRAMMED | PROGRAMMED |
| 0 | UNPROGAMMED | UNPROGAMMED |

ONE-TIME PROGRAMMABLE (OTP) MEMORY DEVICE FOR READING MULTIPLE FUSE BITS

CROSS-REFERENCE TO RELATED APPLICATION

Korean Patent Application No. 10-2016-0133563, filed on Oct. 14, 2016, and entitled, "One-Time Programmable (OTP) Memory Device for Reading Multiple Fuse Bits," is incorporated by reference herein in its entirety.

BACKGROUND

1. Field

One or more embodiments described herein relate a one-time programmable memory device for reading multiple fuse bits.

2. Description of the Related Art

A non-volatile memory device retains stored data when powered off. Examples of non-volatile memory devices include read only memories, magnetic memories, optical memories, and flash memories. One type of non-volatile memory device is known as a one-time programmable (OTP) memory. Once data is written or programmed in an OTP memory, the data cannot be altered. This is because, after data is programmed in the OTP memory cell, the structure of the cell is irreversibly changed. OTP memory devices are used as embedded devices that store, for example, information relating to the repair of other devices, analog trimming, and security codes.

SUMMARY

In accordance with one or more embodiments, a one-time programmable (OTP) memory device includes an OTP cell array including a plurality of OTP memory cells respectively connected to a plurality of bitlines; a latch controller to generate a latch address signal indicating an address that is changed sequentially in an enable mode to initialize the OTP memory device; a column selection circuit to electrically connect a plurality of bitline groups of the bitlines to a plurality of input-output lines sequentially based on the latch address signal in the enable mode; and a latch circuit to receive and store fuse bits provided sequentially through the bitline groups and the input-output lines in the enable mode.

In accordance with one or more other embodiments, a one-time programmable (OTP) memory device includes an OTP cell array including a plurality of OTP memory cells respectively connected to a plurality of bitlines; a latch controller to generate a latch address signal indicating an address that is changed sequentially regardless of an external address signal in an enable mode to initialize the OTP memory device and to generate a plurality of latch selection signals that are enabled sequentially; a column selection circuit to electrically connect N bitline groups of the bitlines to M input-output lines sequentially in the enable mode based on the latch address signal, where N is a natural number greater than 1 and M is a natural number greater than 1; and a latch circuit to receive and store N*M fuse bits that are provided sequentially through the bitline groups and the input-output lines in the enable mode based on the latch selection signals.

In accordance with one or more other embodiments, an apparatus includes a controller to generate a control signal for a one-time programmable (OTP) memory device; first logic to electrically connect bitline groups to input-output lines based on the control signal; and second logic to store a number of fuse bits to be sequentially provided through the bitline groups and the input-output lines, wherein the number of fuse bits is greater than a number of the input-output lines.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
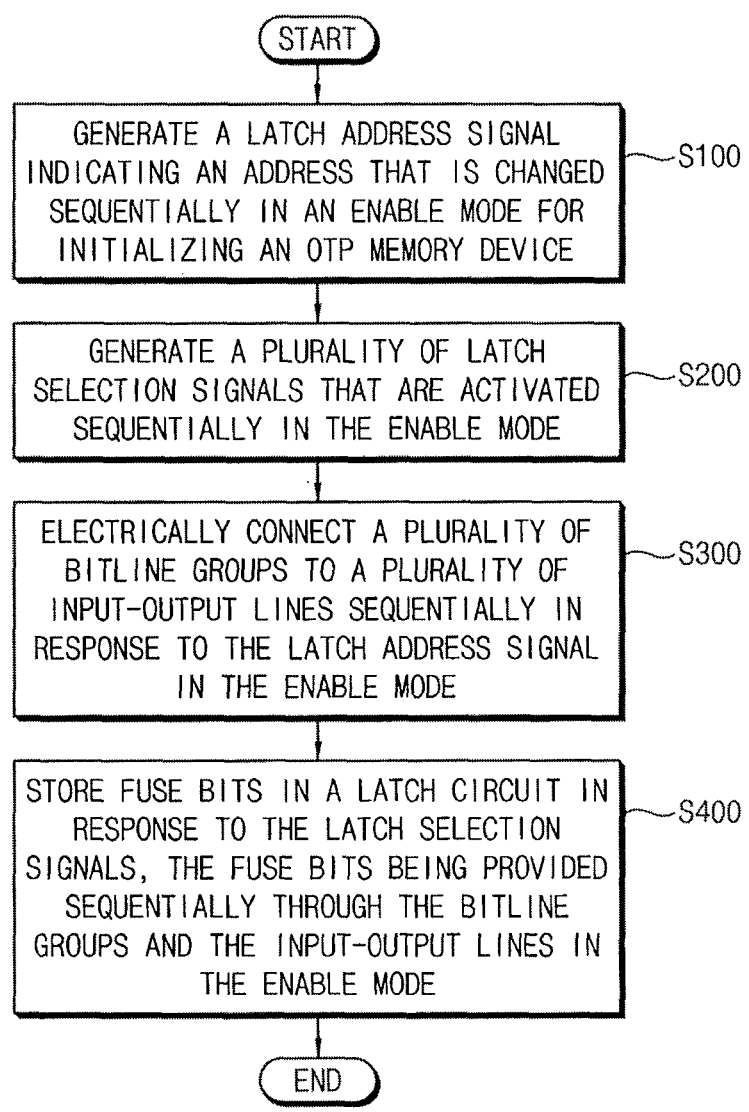
FIG. 1 illustrates an embodiment of a method for operating a one-time programmable (OTP) memory device.

FIG. 1 illustrates an embodiment of a method for operating a one-time programmable (OTP) memory device. Referring to FIG. 1, a latch address signal LADD is generated in an enable mode for initializing an OTP memory device (S100). The latch address signal LADD indicates an address that is changed sequentially. A plurality of latch selection signals LSEL are also generated in the enable mode (S200). The latch selection signals LSEL are activated sequentially. The enable mode may be, for example, an initialization mode.

In some example embodiments, the latch address signal LADD may be generated based on a reset signal RST for reading out fuse bits. All address signals from external devices may be blocked by the reset signal RST. Thus, the latch address signal LADD may be generated internally in the enable mode regardless of any address signal from the external devices.

A plurality of bitline groups are electrically connected to a plurality of input-output lines sequentially based on the latch address signal LADD in the enable mode (S300). In addition, fuse bits are stored in a latch circuit based on the latch selection signals LSEL (S400). The fuse bits are provided sequentially through the bitline groups and the input-output lines in the enable mode. The fuse circuit may store more bits than the number of the input-output lines. For example, when the number of the input-output lines is M, the latch circuit may store N*M bits, where N and M are natural number greater than 1.

The memory cell array of the OTP memory device may store the fuse bits including information for generating a lock signal indicating a programmable status of the OTP memory device, a voltage trim code for adjusting a voltage level of an internal voltage of the OTP memory device, or other information. The fuse bits are read out in the enable mode for initializing the OTP memory device. The read fuse bits are used for normal operations of the OTP memory device. One type of OTP memory device which has been proposed may be configured to read out the fuse bits internally based on the reset signal RST in the enable mode or the initialization mode before performing a program operation and a read operation in the normal operation mode. The reset signal RST blocks all external addresses from being applied to the OTP memory device. Thus, the number of the available fuse bits is limited to the number of the input-output lines.

According to example embodiments, performance of the OTP memory device may be enhanced by providing a greater number of fuse bits than the number of the limited input-output lines, through the sequential selection of the bitline groups and the latch circuit in the enable mode.

Figure 2:
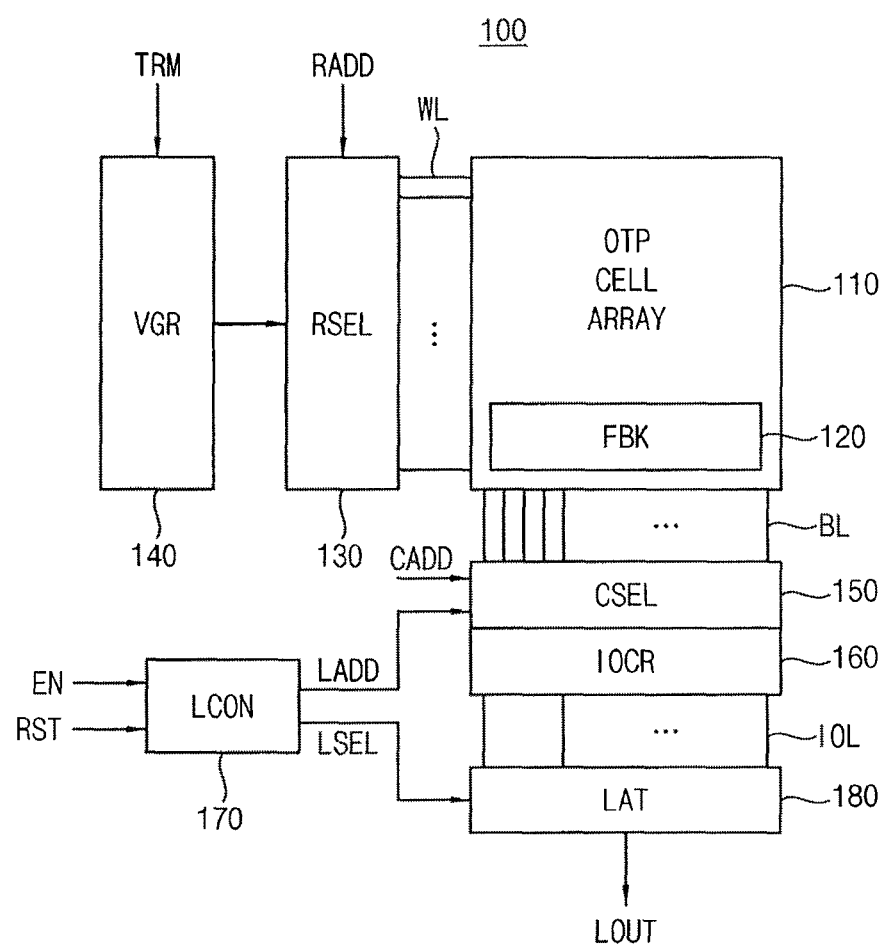
FIG. 2 illustrates an embodiment of an OTP memory device.

FIG. 2 illustrates an embodiment of an OTP memory device 100 which may include an OTP cell array 110, a row selection circuit RSEL 130, a voltage generator VGR 140, a column selection circuit CSEL 150, an input-output circuit IOCR 160, a latch controller LCON 170 and a latch circuit LAT 180.

The OTP cell array 110 may include a plurality of OTP memory cells coupled to a plurality of bitlines BL and a plurality of wordlines WL, respectively. The wordlines WL may include, for example, voltage wordlines WLP and read wordlines WLR.

The OTP cell array 110 may include a fuse block FBK 120 and a normal block corresponding to a remaining portion other than the fuse block 120. The fuse block 120 may store fuse bits that are read out in the enable mode. The normal block may store normal bits read out in the normal operation mode after the enable mode. As described above, the fuse bits may include information for generating a lock signal indicating the programmable status of the OTP memory device, a voltage trim code for adjusting a voltage level of an internal voltage of the OTP memory device, and/or other information.

Figure 6:
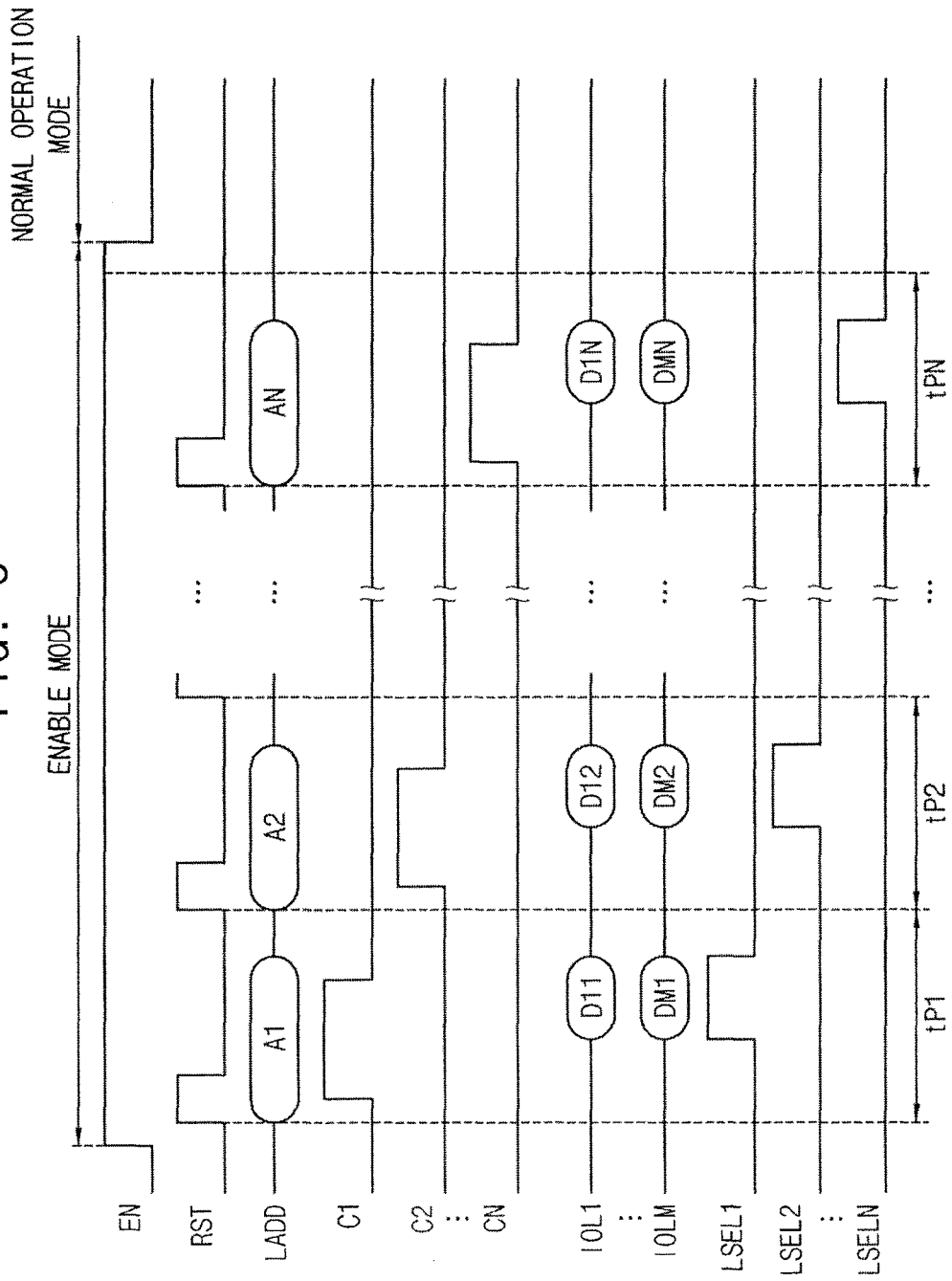
FIG. 6 illustrates an embodiment of timing signals for OTP memory device.

As illustrated in FIG. 6, the operation modes of the OTP memory device 100 may include an enable mode for initializing the OTP memory device 100 and a normal operation mode after the enable mode. In the enable mode, the fuse bits may be read out from the fuse block 120. In the normal operation mode, the normal bits may be programmed or written in the normal block or the programmed normal bits may be read out from the normal block.

Figure 11:
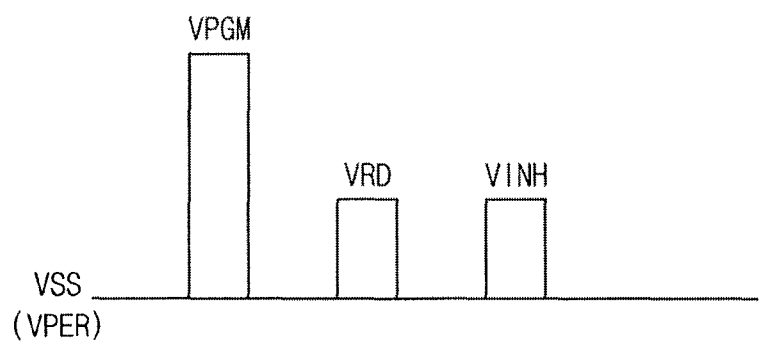
FIG. 11 illustrates a relationship between operational voltages and a threshold voltage of an OTP memory cell according to one embodiment.

The row selection circuits 130 may include a row decoder for selecting a wordline WL corresponding to a row address RADD. The voltage generator 140 may generate at least one internal voltage based on a voltage trim code TRM. For example, the voltage generator 140 may generate a program voltage VPGM, a read voltage VRD, and/or another voltage, for example, as illustrated in FIG. 11.

The column selection circuit 150 may include a column gate circuit and a column decoder for selecting a bitline BL corresponding to a column address signal CADD or a latch address signal LADD. The column decoder may generate column selection signals based on the column address signal CADD or the latch address signal LADD. The column gate circuit may include a plurality of switches that are selectively turned on based on the column selection signals. The switch corresponding to the column address signal CADD or latch address signal LADD may be turned on to select the bitline BL.

The input-output circuit 160 may include a read sense amplifier SA and a write driver WD. The input-output circuit 160 may be connected to the bitlines BL through the column selection circuits 150. The read sense amplifier SA may perform a read operation for sensing the data stored in the OTP memory cells and providing the read data. The write driver WD may perform a write operation for storing the write data into the OTP memory cells. The write driver WD and the read sense amplifier SA may be formed in a same circuit or device or may be formed in separate circuits or devices.

The latch controller 170 may generate the latch address signal LADD indicating an address that is changed sequentially in the enable mode for initializing the OTP memory device 100. In some example embodiments, the latch controller 170 may generate the latch address signal LADD based on an enable signal EN and a reset signal RST. The column selection circuit 150 may electrically connect a plurality of bitline groups of the bitlines BL to a plurality of input-output lines IOL sequentially based on the latch address signal LADD in the enable mode.

The latch circuit 180 may receive and store the fuse bits that are provided sequentially through the bitline groups and the input-output lines IOL in the enable mode. The stored fuse bits may be provided as a latch output signal LOUT. In some example embodiments, the latch controller 170 may generate a plurality of latch selection signals LSEL that are activated sequentially in the enable mode. The latch circuit 180 may store the fuse bits sequentially based on latch selection signals LSEL.

Thus, performance of the OTP memory device may be enhanced by providing a greater number of fuse bits than the number of the limited input-output lines, through the sequential selection of the bitline groups and latch circuit in the enable mode.

Figure 3:
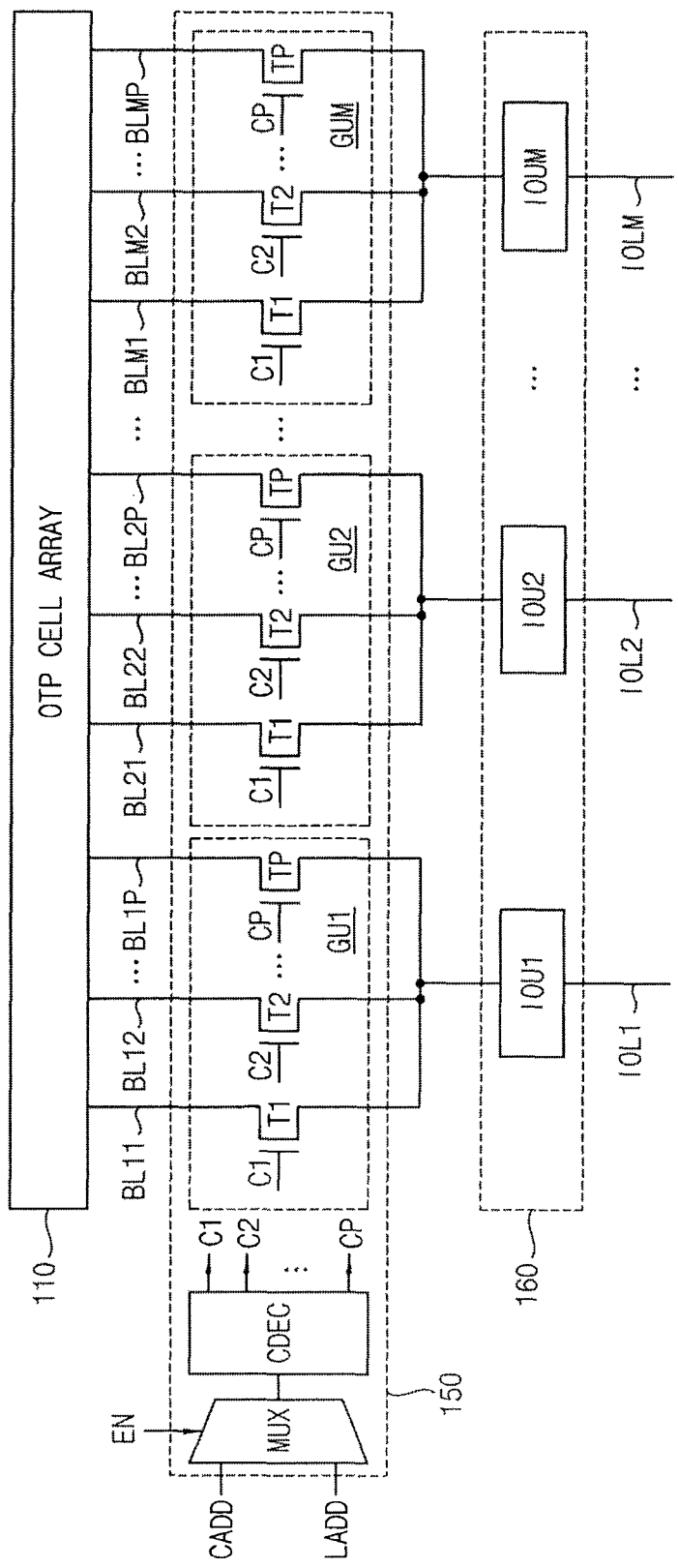
FIG. 3 illustrates an embodiment of a column selection circuit.

FIG. 3 illustrates an embodiment of the column selection circuit 150 in the OTP memory device of FIG. 2. Embodiments of the OTP cell array 110 and the input-output circuit 160 are also illustrated in FIG. 3.

Referring to FIG. 3, the column selection circuit 150 may include a multiplexer MUX, a column decoder CDEC, and a plurality of unit gate circuits GU1~GUM. The multiplexer MUX may select and output the latch address signal LADD in the enable mode. The multiplexer MUX may also select and output the column address signal CADD provided from an external device in the normal operation mode after the enable mode. In some example embodiments, the multiplexer MUX may selectively output the latch address signal LADD or the column address signal CADD based on an enable signal EN. Activation of the enable signal EN may indicate the enable mode and deactivation of the enable signal EN may indicate the normal operation mode. The enable signal EN may be provided from a processor that is integrated with the OTP memory device in a semiconductor integrated circuit.

The column decoder CDEC may generate column selection signals C1~CP for selecting one of the bitline groups based on an output of the multiplexer MUX. Only one of the column selection signals C1~CP may be activated at one time. A first bitline group BL11, BL21 and BLM1 may be selected when a first column selection signal C1 is activated. A second bitline group BL12, BL22 and BLM2 may be selected when a second column selection signal C2 is activated. In this way, a P-th bitline group BL1P, BL2P and BLMP may be selected when a P-th column selection signal CP is activated.

The input-output circuit 160 may include a plurality of input-output unit circuits IOU1~IOUM. The selected bitline group may be electrically connected to the input-output lines IOL1~IOLM through the input-output unit circuits IOU1~IOUM.

In normal operation mode, the multiplexer MUX may select the column address signal CADD from an external device. The column decoder CDEC may activate one signal corresponding to the column address signal CADD among the column selection signals C1~CP.

In enable mode, the multiplexer MUX may select the latch address signal LADD from the latch controller 170. The column decoder CDEC may activate one signal corresponding to the latch address signal LADD among the column selection signals C1~CP. The latch controller 170 may generate the latch address signal LADD to indicate the address(es) that has/have been sequentially changed. Accordingly, the column selection signals C1~CP may be activated sequentially based on the latch address signal LADD in the enable mode. As a result, the bitline groups may be selected sequentially. The sequentially-selected bitline groups may be electrically connected sequentially to the input-output lines IOL1~IOLM through the input-output circuit 160.

Figure 4:
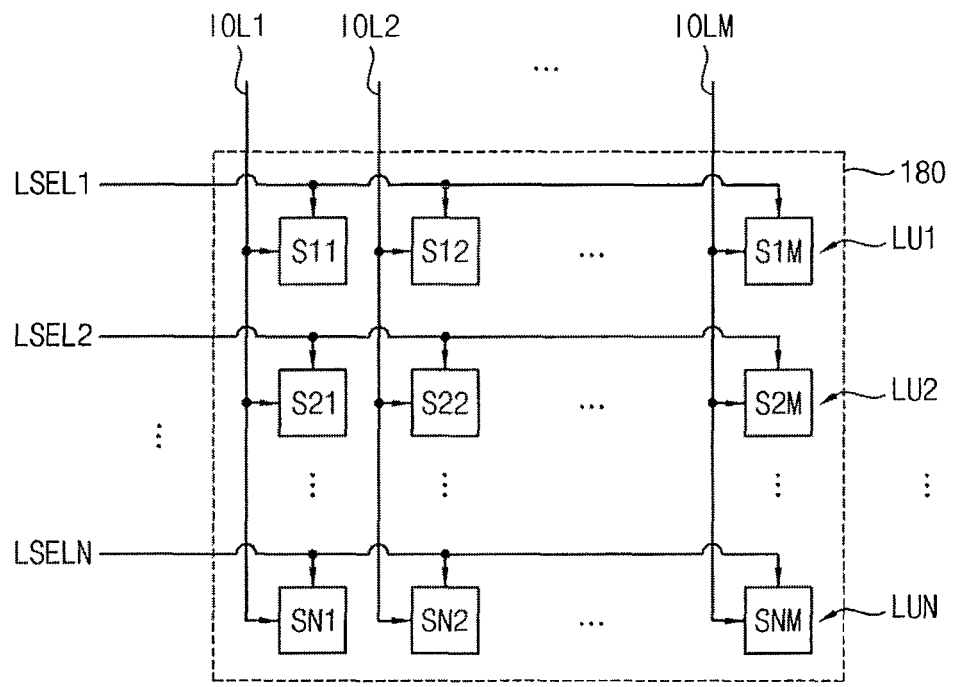
FIG. 4 illustrates an embodiment of a latch circuit in the OTP memory device.

FIG. 4 illustrates an example embodiment of the latch circuit 180 in the OTP memory device of FIG. 2. Referring to FIG. 4, the latch circuit 180 may include N*M one-bit latches S11 through SNM for storing the N*M data bits provided through the input-output lines IOL1~IOLM for N times the unit period. The one-bit latches S11 through SNM may be grouped into the N latch units LU1 through LUN. The first latch unit LU1 includes M one-bit latches S11 through S1M of the first row. The second latch unit LU2 includes M one-bit latches S21 through S2M of the second row. In this way, the N-th latch unit LUN includes M one-bit latches SN1 through SNM of the N-th row.

The input-output lines IOL1~IOLM are commonly coupled to the latch units LU1 through LUN. The latch units LU1~LUM receive respective ones of the latch selection signals LSEL1~LSELN that are activated sequentially and that are to be enabled sequentially. When the first latch selection signal LSEL1 is activated, the one-bit latches S11 through S1M in the first latch unit LU1 are enabled to store data bits of the first unit period. When the second latch selection signal LSEL2 is activated, the one-bit latches S21 through S2M in the second latch unit LU2 are enabled to store data bits of the second unit period. In this way, when the N-th latch selection signal LSELN is activated, the one-bit latches SN1 through SNM in the N-th latch unit LUN are enabled to store data bits of the N-th unit period. As a result, N*M data bits or fuse bits may be stored in the latch circuit 180 based on the N latch selection signals LSEL1~LSELN that are activated sequentially.

Figure 5:
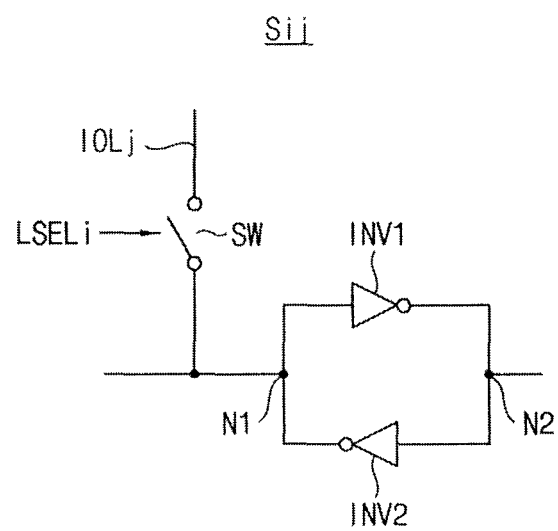
FIG. 5 illustrates an embodiment of a one-bit latch.

FIG. 5 illustrates an example embodiment of one-bit latch Sij in the latch circuit 180 of FIG. 4. Referring to FIG. 5, the one-bit latch Sij may include two inverters INV1 and INV2 coupled between two nodes N1 and N2, with inputs and outputs crossed. The one-bit latch Sij may latch a fuse bit transferred through the corresponding input-output line IOLj and a switch SW which is turned-on based on the corresponding latch selection signal LSELi.

In one type of OTP memory device, fuse bits are read out internally based on the reset signal RST in the enable mode or initialization mode. The reset signal RST blocks all external addresses from being applied to the OTP memory device. Thus, the number of the available fuse bits is limited to the number of the input-output lines. According to example embodiments, performance of an OTP memory device may be enhanced by providing a greater number N*M of fuse bits than the number M of the limited input-output lines, through sequential selection of the bitline groups and the latch circuit in the enable mode.

FIG. 6 illustrates an embodiment of signals for operating the OTP memory device of FIG. 2. Referring to FIGS. 1 through 6, activation of the enable signal EN may indicate the enable mode for initializing the OTP memory device 100 and deactivation of the enable signal EN may indicate the normal operation mode after the enable mode. Even though FIG. 6 illustrates that the enable signal EN is activated in the logic high level, the enable signal EN may be activated in the logic high level.

The latch controller 170 may generate latch address signal LADD indicating the address that is changed sequentially for each of first through N-th unit periods tP1~tPn. The latch address signal LADD may indicate a first address A1 during the first unit period tP1 and a second address A2 during the second unit period tP2. In this way, an N-th address AN during an N-th unit period tPN. According to example embodiments, the addresses A1~AN may increase sequentially or decrease sequentially.

As illustrated in FIG. 6, the unit periods tP1~tPN may correspond to activation periods of the reset signal RST. For example, the latch controller 170 may change the address indicated by the latch address signal LADD whenever the reset signal RST is activated. The reset signal RST may be provided, for example, from a processor that is integrated with the OTP memory device in the semiconductor integrated circuit. The processor may activate the reset signal RST by a predetermined number of times N. The activation number N of the reset signal RST may be less than or equal to the number P of the entire bitline groups or the number P of column selection signals in FIG. 3.

The multiplexer MUX of the column selection circuit 180 may select the latch address signal LADD based on the activation of the enable signal EN. The column decoder CDEC may sequentially activate the column selection signals C1~CN corresponding to the addresses A1~AN indicated by the latch address signal LADD. For example, as illustrated in FIG. 6, the first column selection signal C1 is activated during the first unit period tP1 and the second column selection signal C2 is activated during the second unit period tP2. In this way, an N-th column selection signal CN is activated during an N-th unit period tPN.

The first bitline group BL11, BL21 and BLM1 is selected and electrically connected to the input-output lines IOL1~IOLM while the first column selection signal C1 is activated. The second bitline group BL12, BL22 and BLM2 is selected and electrically connected to the input-output lines IOL1~IOLM while the second column selection signal C2 is activated. In this way, the P-th bitline group BL1P, BL2P and BLMP is selected and electrically connected to the input-output lines IOL1~IOLM while the P-th column selection signal CP is activated.

Accordingly, as illustrated in FIG. 6, first fuse bits D11~DM1 may be provided through the first bitline group BL11~BLM1 and the input-output lines IOL1~IOLM during the first unit period tP1. Second fuse bits D12~DM2 may be provided through the second bitline group BL12~BLM2 and the input-output lines IOL1~IOLM during the second unit period tP2. In this way, an N-th fuse bits D1N~DMN may be provided through an N-th bitline group BL1N~BLMN and the input-output lines IOL1~IOLM during the N-th unit period tPN.

The latch controller 170 may generate latch selection signals LSEL1~LSELN that are activated sequentially in the enable mode. For example, the latch controller 170 may determine the activation timings of the latch selection signals LSEL1~LSELN based on the reset signal RST. For example, as illustrated in FIG. 6, the first latch selection signal LSEL1 may be activated during the first unit period tP1 and the second latch selection signal LSEL2 may be activated during the second unit period tP2. Thus, an N-th latch selection signal LSELN may be activated during an N-th unit period tPN.

Based on the sequentially-activated latch selection signals LSEL1~LSELN, the latch circuit 180 may sequentially store the N*M fuse bits provided through the N bit line groups and the M input-output lines IOL1~IOLM. The first fuse bits D11~DM1 read through the first bitline group BL11~BLM1 during the first unit period tP1 may be stored in the first latch unit LU1 of the latch circuit 180 based on activation of the first latch selection signal LSEL1. The second fuse bits D12~DM2 read through the second bitline group BL12~BLM2 during the second unit period tP2 may be stored in the second latch unit LU2 of the latch circuit 180 based on activation of the second latch selection signal LSEL2. In this way, an N-th fuse bits D1N~DMN read through the N-th bitline group BL1N~BLMN during the N-th unit period tPN may be stored in an N-th latch unit LUN of the latch circuit 180 based on activation of the N-th latch selection signal LSELN.

In some example embodiments, as illustrated in FIG. 6, the reset signal RST may be activated the predetermined designation number of times. The latch controller 170 may change the address indicated by the latch address signal LADD, for example, whenever the reset signal RST is activated. In other example embodiments, the reset signal RST may be activated only one time. In this case, the latch controller may be configured to change the address indicated by the latch address signal LADD the designation number of times based on activation of the reset signal RST. As a result, the bit number of the fuse bits stored in the latch circuit may be determined or limited by the activation number N of the reset signal RST or the designation number N.

Thus, an OTP memory device and method for operating the OTP memory device according to example embodiments may achieve enhanced performance by providing a greater number of fuse bits than the number of limited input-output lines, through sequential selection of the bitline groups and the latch circuit in enable mode.

Figure 7:
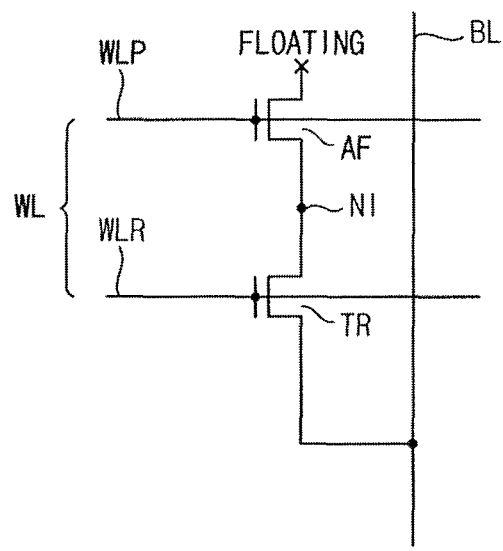
FIG. 7 illustrates an embodiment of an OTP memory cell.

FIG. 7 illustrates an example embodiment of an OTP memory cell UCa in the OTP memory device of FIG. 2. Referring to FIG. 7, the OTP memory cell UCa may include an antifuse AF and a read transistor TR. The antifuse AF may be connected between a corresponding voltage word line WLP and an intermediate node NI. The read transistor TR may be connected between the intermediate node NI and a corresponding bit line BL.

The antifuse AF may include, for example, with a metal oxide semiconductor (MOS) transistor. In an example embodiment, as illustrated in FIG. 7, the drain electrode of the MOS transistor AF may be floated, the source electrode of the MOS transistor AF may be connected to the intermediate node NI, and the gate electrode of the MOS transistor AF may be connected to the voltage word line WLP.

The antifuse AF is just an example element of the OTP memory cell. In one embodiment, the antifuse AF may have an electrical features opposite to a typical fuse, e.g., the antifuse AF may have a higher resistance value in an unprogrammed state and a lower resistance value in a programmed state.

In one embodiment, the antifuse AF may include a dielectric material between two conductors. The dielectric material may be broken and programmed by applying a high voltage between the two conductors for a sufficient time. When programmed in this manner, the two conductors may be electrically connected through the broken dielectric material. Thus, the antifuse AF may have the lower resistance value.

In this antifuse type OTP memory, the MOS capacitor may have a thin gate oxide that is used as the antifuse AF. A high voltage may be applied between the two electrodes of the MOS capacitor to program the MOS capacitor. An OTP memory cell using a MOS capacitor may have a smaller cell area and a lower program current than other embodiments. Thus, low power and byte-wide programming may be achieved.

A program voltage VPGM of a relatively high voltage level may be applied to the voltage word line WLP in program mode. A read voltage VRD having a lower voltage level than the program voltage VPGM may be applied to the voltage word line WLP in read mode. A selection voltage with a voltage level sufficient to turn on the read transistor TR may be applied to the read word line WLR in program and read modes.

In program mode, a program permission voltage VPER may be applied to the bit lines connected to the OTP memory cells to be programmed and a program inhibition voltage VINH greater than the program permission voltage VPER may be applied to the bit lines connected to the OTP memory cells that are not to be programmed. For example, the program permission voltage VPER may be set to ground voltage VSS, and/or the program inhibition voltage VINH and the read voltage VRD may be set to the power supply voltage. The voltage levels of the program voltage VPGM, read voltage VRD, program permission voltage VPER, and/or program inhibition voltage VINH may be different in other embodiments, for example, depending on the characteristics and/or configure of the OTP memory cells.

The programming of the antifuse AF may be performed in program mode, e.g., the program voltage VPGM may be applied to the voltage word line WLP, the selection voltage may be applied to the read word line WLR to turn on the read transistor TR, and the program permission voltage VPER may be applied to the bit line BL.

Figure 8:
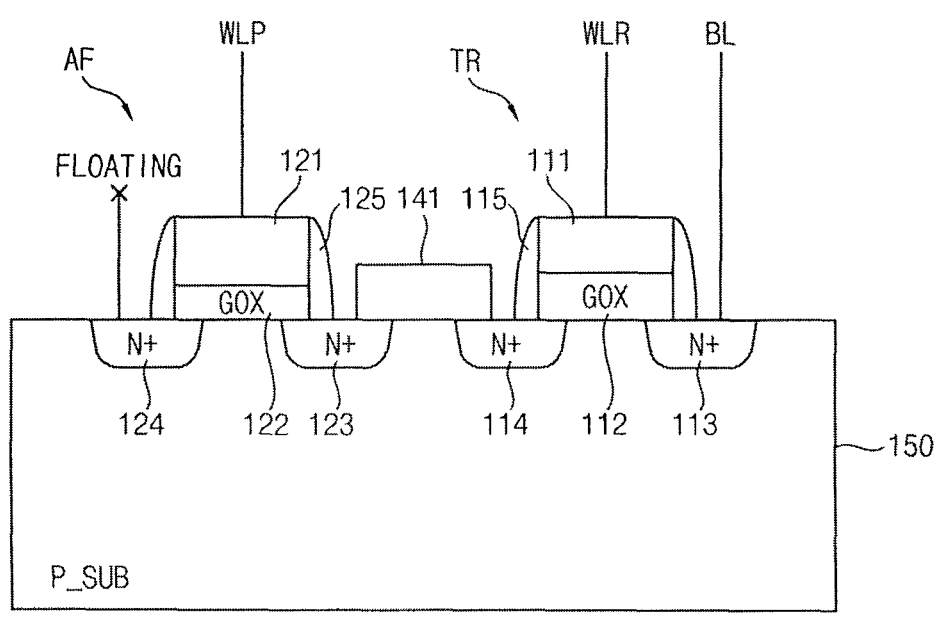
FIG. 8 illustrates a cross-sectional embodiment of the OTP memory cell.

FIG. 8 is a cross-sectional embodiment of the OTP memory cell UCa of FIG. 7. Referring to FIG. 8, the memory cell UCa may include an antifuse AF and a read transistor TR on a same substrate P-SUB 150. The read transistor TR may include a first gate 111 connected to a corresponding read word line WLR, a first gate insulation layer GOX 112 insulating the first gate 111 from the substrate 150, a first source region 113 connected to a corresponding bit line BL, and a first drain region 114.

The antifuse AF may include a second gate 121 connected to a corresponding voltage word line WLP, a second gate insulation layer 122 insulating the second gate 121 from the substrate 150, a second source region 123 connected to the first drain region 114 of the read transistor TR, and a second drain region 124 that is floated.

The second source region 123 of the antifuse AF may be electrically connected to the first drain region 114 of the read transistor TR by a conduction path 141. The conduction path 141 may include metal lines in an upper space and interlayer structure such as vias for connecting the metal lines to the upper surface of the substrate 150. In some example embodiments, the second source region 123 of the antifuse AF and the first drain region 114 of the read transistor TR may be combined. In such a case, the conduction path 141 may be omitted.

For example, the substrate 150 may be doped with P-type impurities, and the source regions 113 and 123 and the drain regions 114 and 124 may be doped with N-type impurities.

The read transistor TR may further include a first spacer 115 on sidewalls of the first gate 111 and the first gate insulation layer 112. The antifuse AF may further include a second spacer 125 on sidewalls of the second gate 121 and the second gate insulation layer 122.

An embodiment of a method for manufacturing the OTP memory cell UCa will now be described. The first gate insulation layer 112, the second gate insulation layer 122, and the third insulation layer 132 may be formed on the substrate 150. The first gate 111 may be formed on the first gate insulation layer 112. The second gate 121 may be formed on the second gate insulation layer 122. The source regions 113 and 123 and the drain regions 114 and 124 may be formed, for example, by an ion implantation process. The ion implantation process may implant N-type impurities into different sides of the first gate 111 and the second gate 121. The spacers 115 and 125 and the conduction path 141 may then be formed.

Figure 9:
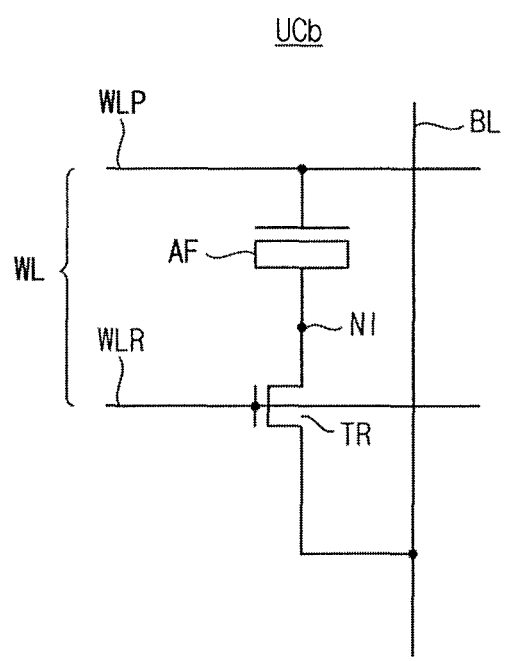
FIG. 9 illustrates another embodiment of an OTP memory cell.

FIG. 9 illustrates another embodiment of an OTP memory cell UCb in the OTP memory device of FIG. 2. Referring to FIG. 9, the OTP memory cell UCb may include an antifuse AF and a read transistor TR. The antifuse AF may be connected between a corresponding voltage word line WLP and an intermediate node NI. The read transistor TR may be connected between the intermediate node NI and a corresponding bit line BL. A gate electrode of the read transistor TR may be connected to a corresponding read word line WLR.

The antifuse AF may include, for example, a metal oxide semiconductor (MOS) transistor. In an example embodiment, as illustrated in FIG. 9, the drain electrode and source electrode of the MOS transistor AF may be connected to the intermediate node NI. The gate electrode of the MOS transistor AF may be connected to the voltage word line WLP. The structure and the manufacturing process of the OTP memory cell UCb of FIG. 9 may be similar, for example, to those of FIG. 8. To implement the MOS capacitor, a conduction path may be added to connect the second source region 123 and the second drain region 124 in FIG. 8.

Figure 10:
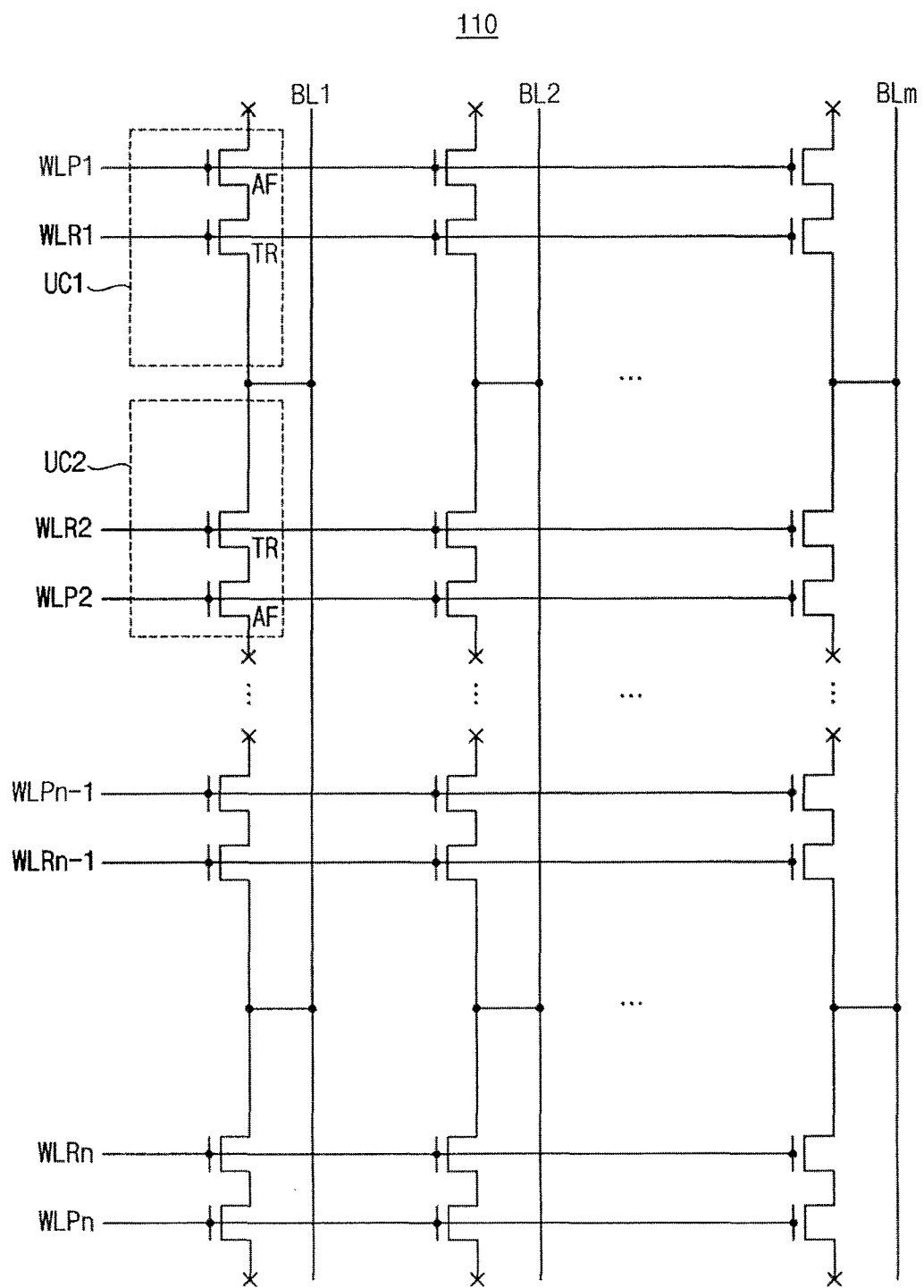
FIG. 10 illustrates an embodiment of an OTP cell array.

FIG. 10 illustrates an embodiment of the OTP cell array 110 in the OTP memory device of FIG. 2. Referring to FIG. 10, the OTP cell array 110 may include a plurality of OTP memory cells UC1 and UC2 connected to a plurality of bit lines BL1~BLm, a plurality of voltage word lines WLP1~WLPn, and a plurality of read word lines WLR1~WLRn arranged in an n*m matrix.

The read transistor TR includes a gate electrode connected to the corresponding read word line WLRx (x=1~n) and a source electrode connected to the corresponding bit line BLy (y=1~m).

The antifuse AF includes a first electrode connected to the corresponding word line WLPx and a second electrode connected to the drain electrode of the read transistor TR. The antifuse AF may be, for example, a MOS transistor. The gate electrode or the first electrode of the MOS transistor AF may be connected to the corresponding voltage word line WLPx. The source electrode or the second electrode of the MOS transistor AF may be connected to the drain electrode of the read transistor TR. The drain electrode of the MOS transistor AF may be floated.

Each of the OTP memory cells UC1 and UC2 may include the antifuse AF, the read transistor TR, and the cell switching transistor CTS. FIG. 9 illustrates a non-limiting example of two unit cells UC1 and UC2 forming a pair. The arrangement of unit cells may be different in anther embodiment.

FIG. 11 illustrates an example of a relationship between operational voltages and a threshold voltage of an OTP memory cell. Referring to FIG. 11, a program voltage VPGM of relatively a high voltage level may be applied to the voltage wordline WLP in program mode. A read voltage VRD having a voltage level lower than the program voltage VPGM may be applied to the voltage wordline WLP in read mode. A selection voltage having a voltage level sufficient to turn on the read transistor TR may be applied to the read wordline WLR in the program and read modes.

In program mode, a program permission voltage VPER may be applied to the bitlines connected to the OTP memory cells to be programmed, and a program inhibition voltage VINH higher than the program permission voltage VPER may be applied to the bitlines connected to the OTP memory cells not to be programmed. For example, the program permission voltage VPER may be a ground voltage VSS, and/or the program inhibition voltage VINH and the read voltage VRD may correspond to the power supply voltage. The voltage levels of the program voltage VPGM, read voltage VRD, program permission voltage VPER, and/or program inhibition voltage VINH may be different in another embodiment, for example, depending on the characteristics and/or configuration of the OTP memory device.

The programming of the antifuse AF may be performed in program mode, e.g., the program voltage VPGM may be applied to the voltage wordline WLP, the selection voltage may be applied to the read wordline WLR to turn on the read transistor TR, and the program permission voltage VPER may be applied to the bitline BL.

The read voltage VRD applied to the voltage wordline WLP in read mode may be lower than the program voltage VPGM. The programmed state or unprogrammed state of the antifuse AF may be detected by sensing the voltage on the bitline BL, which voltage changes depending on the state of the antifuse AF.

Figure 12:
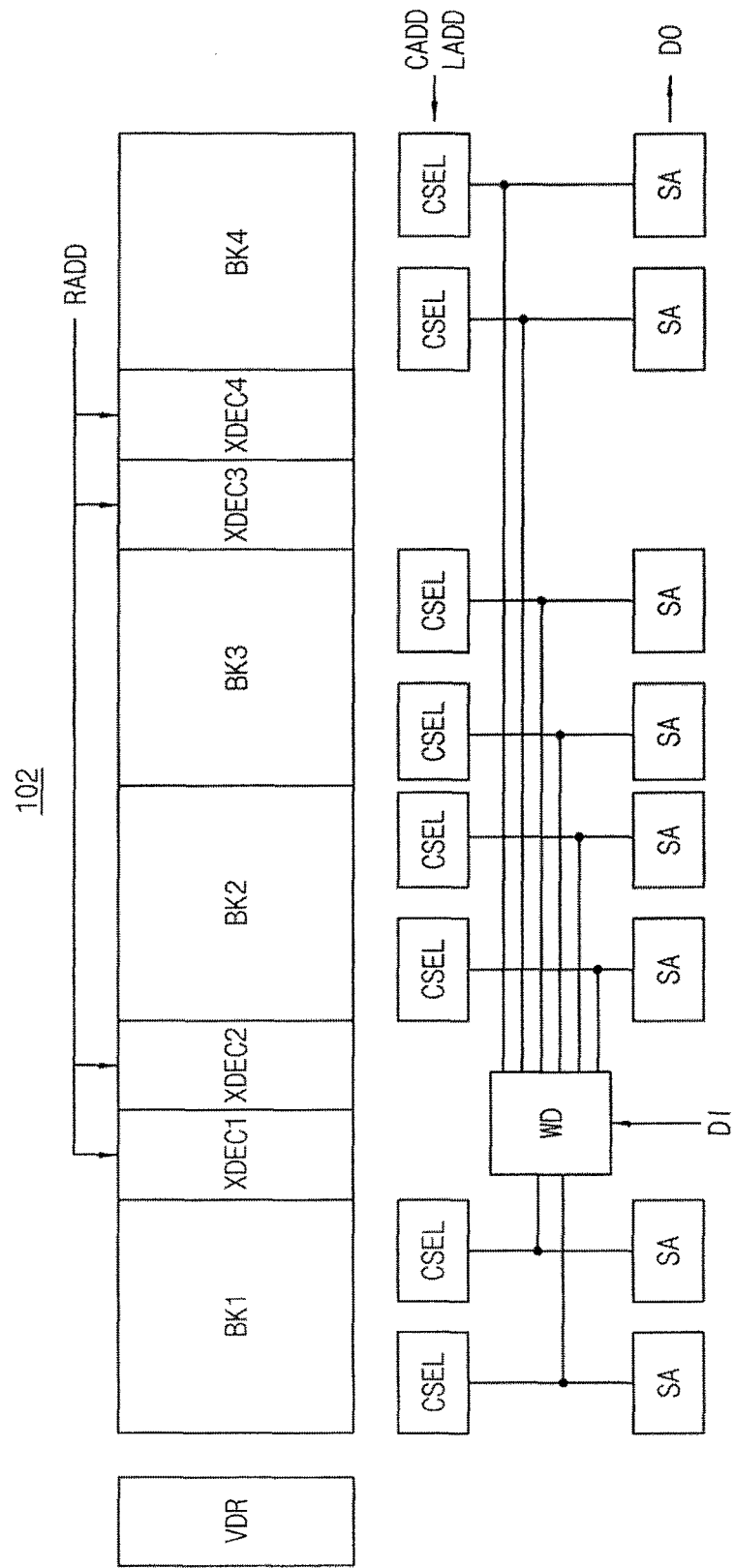
FIG. 12 illustrates another embodiment of an OTP memory device.

FIG. 12 illustrates another embodiment t of an OTP memory device 102 which may include an OTP cell array BK1~BK4, row selection circuits XDEC1~XDEC4 and VDR, column selection circuits CSEL, and read-write circuits SA and WD. The OTP cell array BK1~BK4 may include a plurality of OTP memory cells coupled to a plurality of bit lines BL and a plurality of word lines WL, respectively. The word lines WL may include voltage word lines WLP and read word lines WLR. The OTP memory cells in the OTP cell array may form a plurality of memory banks BK1~BK4. FIG. 12 illustrates four memory banks BK1~BK4 for convenience of illustration, but the number of the memory banks may be different in another embodiment.

The row selection circuits XDEC1~XDEC4 and VDR may include row decoders XDEC1~XDEC4 for selecting a word line WL corresponding to a row address signal RADD and a voltage driver VDR for providing voltages to the word lines WL.

The column selection circuit CSEL may include a column gate circuit and a column decoder for selecting a bit line corresponding to a column address signal CADD or a latch address signal LADD. The column decoder may generate column selection signals based on the column address and a column selection enable signal. The column gate circuit may include a plurality of switches that are selectively turned on based on the column selection signals. The switch corresponding to the column address may be turned on to select the bit line BL.

The read-write circuits SA and WD may be connected to the bit lines BL via the column selection circuit CSEL. The read-write circuit SA and WD may include a read sense amplifier SA and a write driver WD. The read sense amplifier SA may perform a read operation for sensing the data stored in the OTP memory cells and providing the read data. The write driver WD may perform a write operation for storing the write data into the OTP memory cells. The write driver WD and the read sense amplifier SA may be formed in different circuits or devices or in a same circuit or device.

The OTP memory device 102 may program a plurality of bits (e.g., a plurality of OTP memory cells) in the memory banks BK1~BK4 simultaneously in program mode. In some example embodiments, OTP memory device 102 may select and enable one of the memory banks BK1~BK4 and program a plurality of OTP memory cells of a selected row in the selected memory bank simultaneously. In other example embodiments, the OTP memory device 102 may select and enable two or more memory banks of the memory banks BK1~BK4 and program a plurality of OTP memory cells of a selected row in the selected memory banks simultaneously. In still other example embodiments, the OTP memory device 102 may enable all of the memory banks BK1~BK4 and program OTP memory cells corresponding to the number of the memory banks BK1~BK4 (e.g., one OTP memory cell per memory bank) simultaneously.

The write driver WD may program N OTP memory cells based on program data DI of N bits (where N is a positive integer greater than one) with respect to the current program address CPAD. The read sense amplifier SA may generate read data DO of N bits by reading out stored values of the programmed N OTP memory cells.

Figure 13:
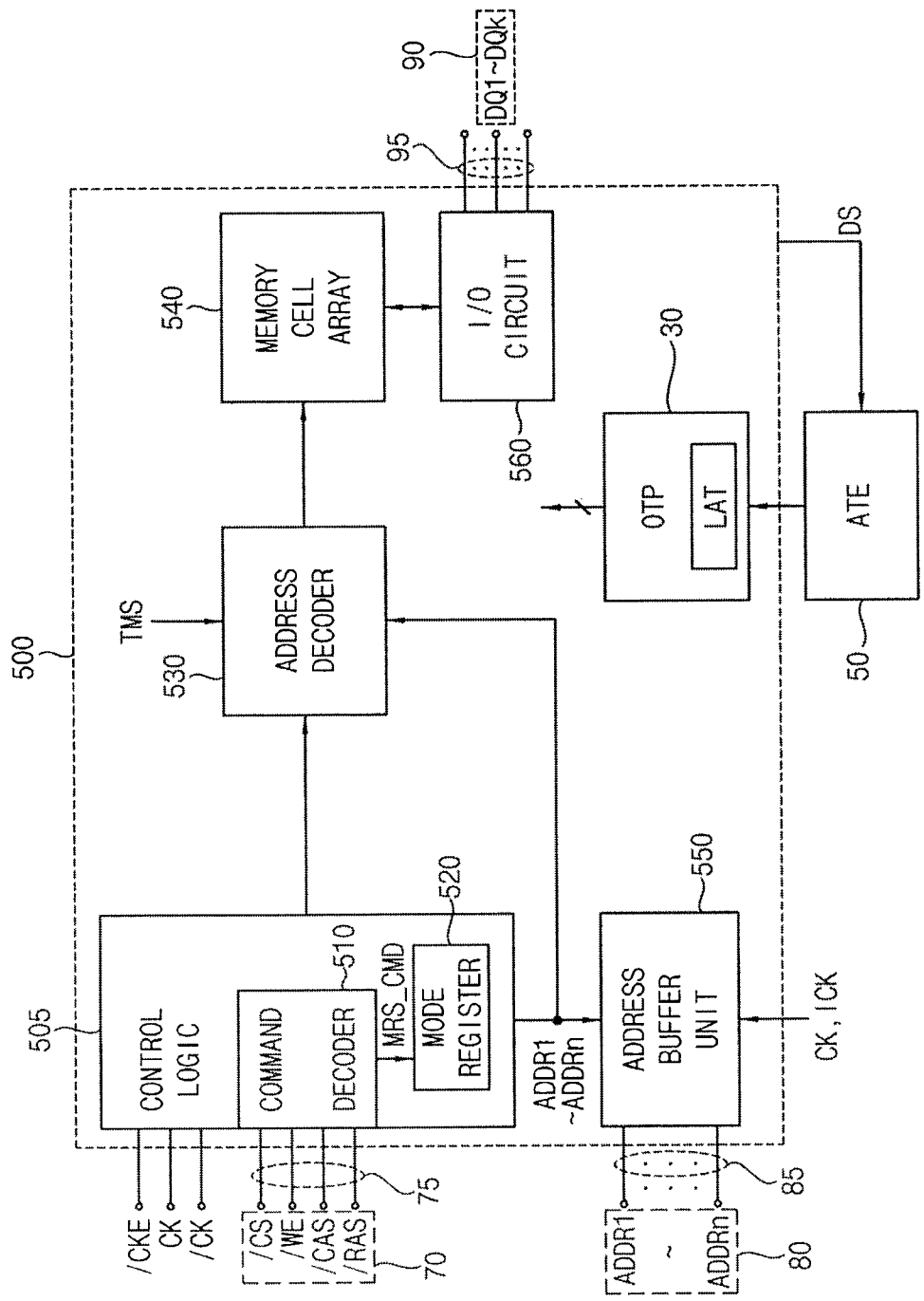
FIG. 13 illustrates an embodiment of a memory device.

FIG. 13 illustrates an embodiment of a semiconductor memory device 500 including an OTP memory device. Referring to FIG. 13, the semiconductor memory device 500 may include control logic 505, an address decoder 530, a memory cell array 540, an address buffer unit 550, an input/output (I/O) unit 560, and an OTP memory device 30.

The control logic 505 receives control signals 70 through command pins 75 and an address signal 80 through address pins 85, and controls the address decoder 430 to access the memory cell array 540 based on commands and the address signal. The control signals 70 include a chip selection signal /CS, a write enable signal /WE, a column address strobe signal /CAS, and a row address strobe signal /RAS. The address signal 30 includes ADDR1~ADDRn. The combination of the control signals /CS, /WE, /CAS, and /RAS designate the command. In some embodiments, the control logic 505 may also receive a clock enable signal /CKE, a clock signal CK, and an inverted clock signal /CK.

The address buffer unit 550 receives the address signal 80 through the address pins 85 and provides the address signal ADDR1~ADDRn to the control logic 505 and the address decoder 430 in synchronization with the clock signal CK or the inverted clock signal /CK.

The I/O unit 560 provides data 90 to the memory cell array 540 or receives the data 90 from the memory cell array 540 through the data pins 95. The data 90 includes DQ1~DQk.

The control logic 505 includes a command decoder 510 and a mode register 520. The command decoder 510 decodes the command designated by the control signals /CS, /WE, /CAS, and /RAS to provide a mode register set (MRS) command MRS_CMD to the mode register 420. Mode register 520 sets the operation mode of the semiconductor memory device 500 based on the MRS command MRS_CMD. The operation modes of the semiconductor memory device 500 may include, for example, a test mode, MRS mode, TMRS mode, and a normal operation mode.

In test mode, an external tester ATE 50 may program data in the OTP memory device 30. The programmed data may be used to control the semiconductor memory device 500. The OTP memory device 30 may include a latch circuit LAT for storing a plurality of fuse bits in the enable mode. Performance of the OTP memory device may be enhanced by providing a greater number of fuse bits than the number of limited input-output lines through sequential selection of the bitline groups and the latch circuit in enable mode.

Figure 14:
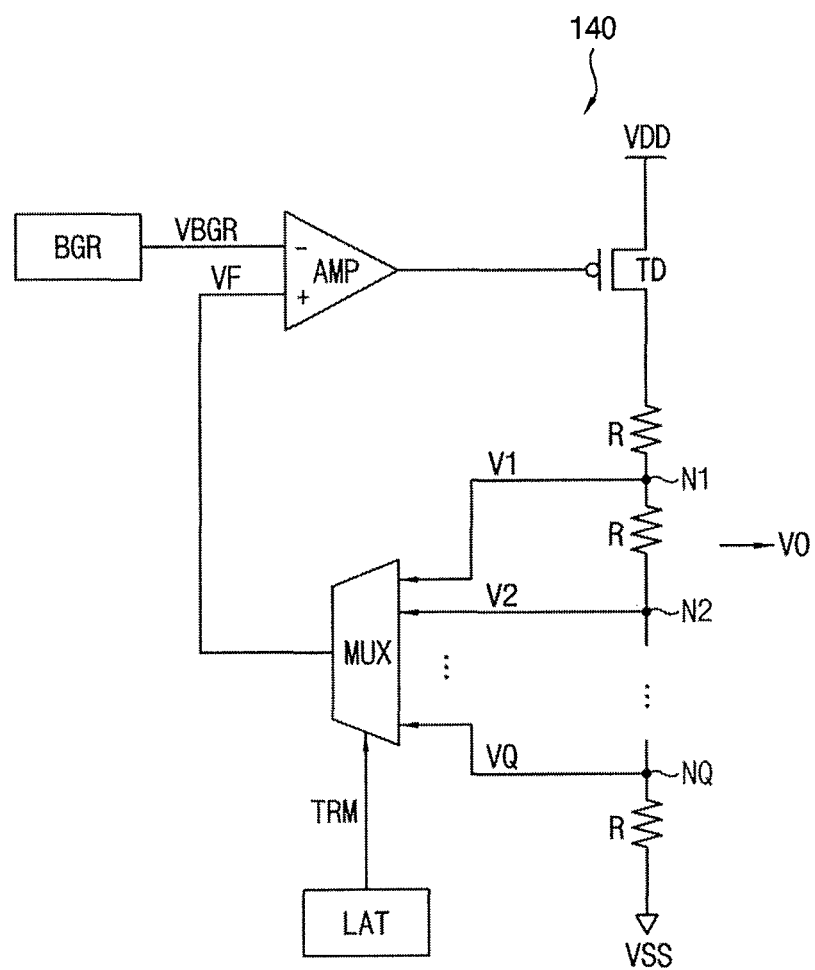
FIG. 14 illustrates an embodiment of a voltage generator.

FIG. 14 illustrates an example embodiment of the voltage generator 140 in the OTP memory device of FIG. 2. The latch circuit LAT is also illustrated in FIG. 14.

Referring to FIG. 14, the voltage generator 140 may include a band gap reference circuit BGR, an operational amplifier AMP, a driving transistor TD, division resistors R, and a multiplexer MUX. The operational amplifier AMP may amplify the difference between a band gap reference voltage VBGR and a feedback voltage to output an amplified voltage. The driving transistor TD is connected to a power supply voltage VDD to generate a driving current corresponding to the amplified voltage of the operational amplifier AMP. The division resistors R are connected in series between the driving transistor and a ground voltage VSS to provide divided voltages V1~VQ through division nodes N1~NQ. The multiplexer MUX may select one of the division voltages V1~VQ based on the above-described voltage trim code TRM and provide the selected one as the feedback voltage VF. An internal voltage V0 may be provided through one of the division nodes N1~NQ. The internal voltage V0 may be the program voltage VPGM, the read voltage VRD or the program inhibition voltage VINH. Through such a negative feedback configuration, the voltage generator 140 may provide the stabilized internal voltage V0 corresponding to the voltage trim code TRM.

The OTP memory device may adjust the voltage level of the internal voltage V0 using the internal voltage trim code TRM, without external signals for trimming. For example, when the internal voltage V0 corresponds to the read voltage VRD, the read margin is decreased due to a reduction of the cell current of the OTP memory cell, when the DC voltage level of the read voltage VRD is relatively low. Reliability may be degraded due to acceleration of the cell degeneration when the read voltage VRD is relatively high. As such, the voltage level of the internal voltage V0 may be maintained at a designed value. Deviations of manufacturing processes and operational conditions may have an adverse effect as transistors are implemented with the Fin structure. Thus, self-DC trimming using the OTP memory cell may be implemented.

Figure 15:
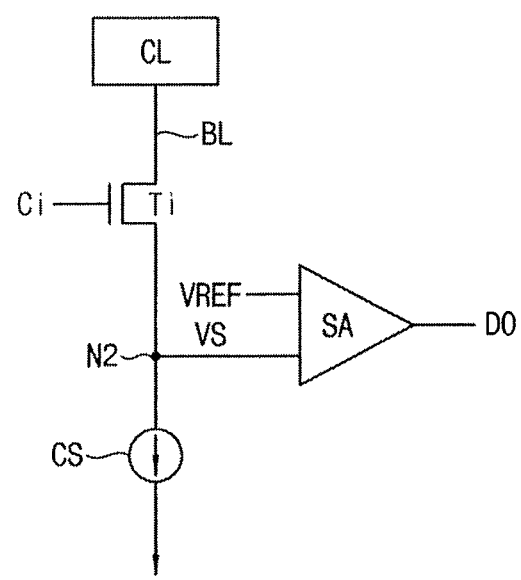
FIG. 15 illustrates an embodiment of a read method in an OTP memory device.
Figure 16A:
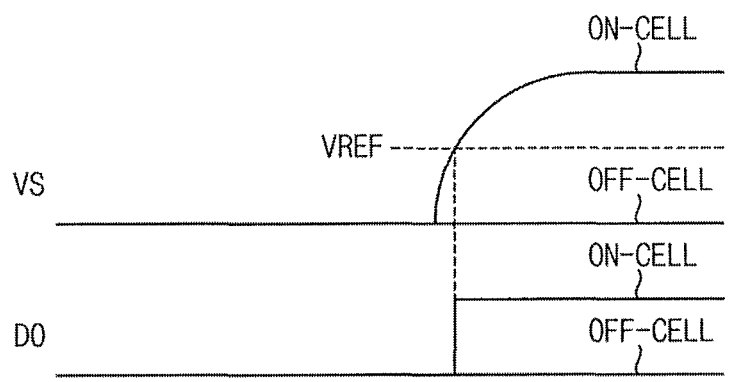
FIGS. 16A and 16B illustrate examples of a sensing error in the read method.
Figure 16B:
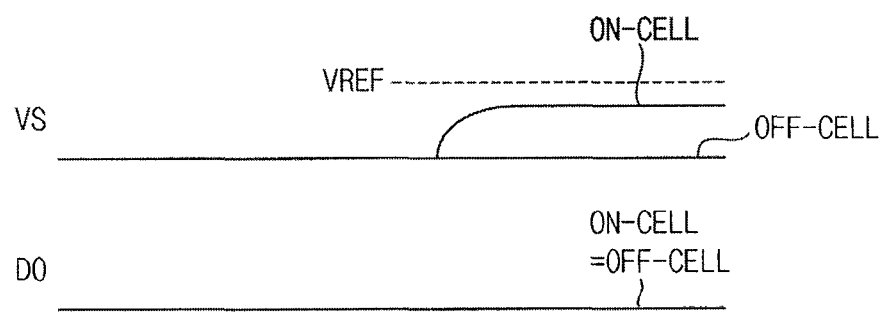

FIG. 15 illustrates an embodiment of a read method in an OTP memory device. FIGS. 16A to 16B illustrate an example of a sensing error in the read method of FIG. 15.

Referring to FIG. 15, an OTP memory cell CL may store a single data bit, which may be read out as an output bit D0. When a column selection signal Ci is activated, a column selection switch Ti is turned on and the OTP memory cell CL subject to the read out operation may be electrically connected to a sensing node NS. A current source CS may be connected to the sensing node NS for a current sensing scheme. A sense amplifier SA may compare a sensing voltage VS at the sensing node NS and a reference voltage VREF to generate the output bit D0.

Referring to FIG. 16A, the sensing voltage VS is increased to be greater than the reference voltage VREF when the OTP memory cell CL is an on-cell that is programmed. The sensing voltage VS remains lower than the reference voltage VREF when the OTP memory cell CL is an off-cell that is not programmed. As a result, the output bit D0 has a logic high level for an on-cell and a logic low level for an off-cell.

Referring to FIG. 16B, when the OTP memory cell has a defect or if an error occurs during a programming process, even a programmed state of an on-cell may not be sufficient. Thus, the sensing voltage VS may not increase to be greater than the reference voltage VREF because the cell current is not sufficient. As a result, the output bit D0 has the logic low level for both an on-cell and an off-cell. Thus, reading of the data bit in the OTP memory cell may not be possible.

When the voltage trim code TRM for trimming the voltage level of the internal voltage is not proper, the entire OTP memory device may not operate normally. Thus, reliability of the voltage trim code TRM may be enhanced. According to example embodiments, each bit of the voltage trim code TRM may be generated based on values stored in the two OTP memory cells, in order to enhance reliability of the voltage trim code TRM. Example embodiments for enhancing reliability of the voltage trim code TRM are described, for example, with reference to FIGS. 17 through 22.

Figures 17, 18:
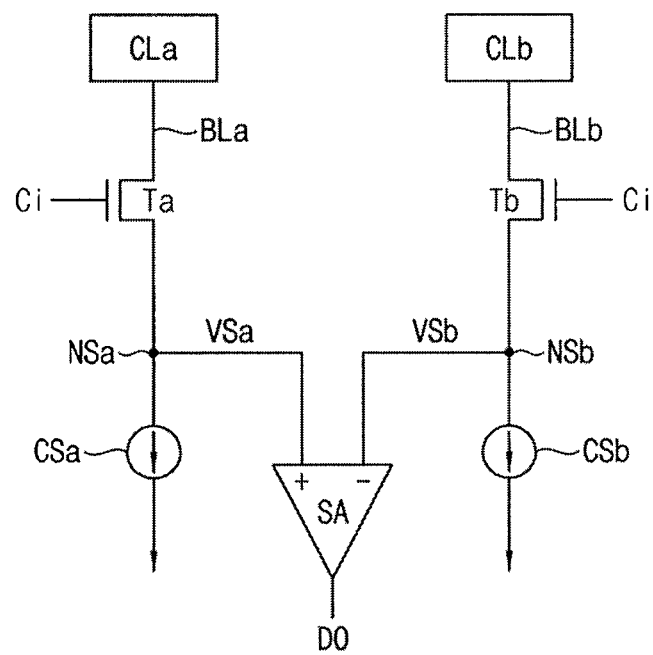
FIG. 17 illustrates another embodiment of a read method in an OTP memory device.
FIG. 18 illustrates an embodiment of a program scheme for a read method.
Figure 19A:
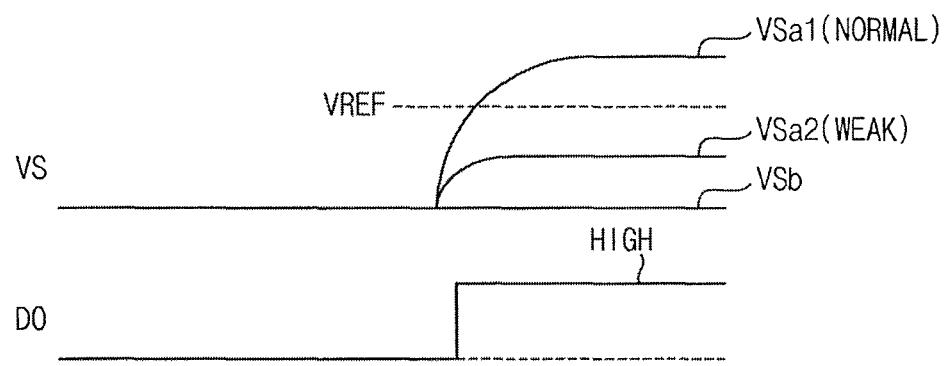
FIGS. 19A and 19B illustrate an embodiment of data sensing in the read method.
Figure 19B:
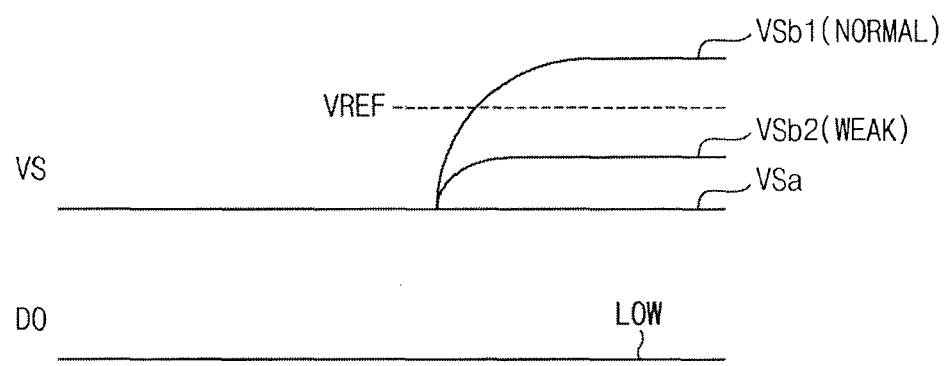

FIG. 17 illustrates an embodiment of a read method in an OTP memory device. FIG. 18 illustrates an embodiment of a program scheme corresponding to the read method of FIG. 17. FIGS. 19A and 19B illustrating embodiments for data sensing in the read method of FIG. 17.

Referring to FIG. 17, each of OTP memory cells CLa and CLb may store a single data bit. A single output bit D0 may be generated based on the data bits stored in the OTP memory cells CLa and CLb. When a column selection signal Ci is activated, column selection switches Ta and Tb are turned on and the OTP memory cells CLa and CLb to be read out may be electrically connected to sensing nodes NSa and NSb through bitlines BLa and BLb. Current sources CSa and CSb may be connected to the sensing nodes NSa and NSb for a current sensing scheme. A sense amplifier SA may compare sensing voltages VSa and VSb at the sensing nodes NSa and NSb to generate the output bit D0.

Referring to FIG. 18, each bit of the voltage trim code TRM is generated based on values stored in the OTP memory cells CLa and CLb, that are programmed by complementary values. For example, the first OTP memory cell CLa may be programmed and the second OTP memory cell CLb may be unprogrammed when the data bit corresponds to logical 1. The first OTP memory cell CLa may be unprogrammed and the second OTP memory cell CLb may be programmed when the data bit corresponds to logical 0.

Referring to FIG. 19A, the output bit D0 may be read out as the logic high level when the first OTP memory cell CLa is the on-cell and the second OTP memory cell CLb is the off-cell. FIG. 19A illustrates the sensing voltage VSa1 at the first sensing node Na when the first OTP memory cell CLa is a normal cell and the sensing voltage VSa2 at the first sensing node Na when the first OTP memory cell CLa is a defective cell or a weak cell. The sense amplifier SA in FIG. 17 compares the difference between the sensing voltage VSa1 or VSa2 at the first sensing node NSa and the sensing voltage VSb at the second sensing node NSb, and the output bit D0 may be read out normally as the logic high level even though the first OTP memory cell is a weak cell.

Referring to FIG. 19B, the output bit D0 may be read out as the logic low level when the first OTP memory cell CLa is the off-cell and the second OTP memory cell CLb is the on-cell. FIG. 19B illustrates the sensing voltage VSb1 at the second sensing node Nb when the second OTP memory cell CLb is a normal cell and the sensing voltage VSb2 at the second sensing node Nb when the second OTP memory cell CLb is a weak cell. The sense amplifier SA in FIG. 17 compares the difference between the sensing voltage VSa at the first sensing node NSa and the sensing voltage VSb1 or VSb2 at the second sensing node NSb, and the output bit D0 may be read out normally as the logic low level even though the first OTP memory cell is a weak cell.

As a result, the reliability of the fuse bits and the performance of the OTP memory device may be enhanced by providing each fuse bit based on the values stored in the multiple OTP memory cells.

Figures 20, 21:
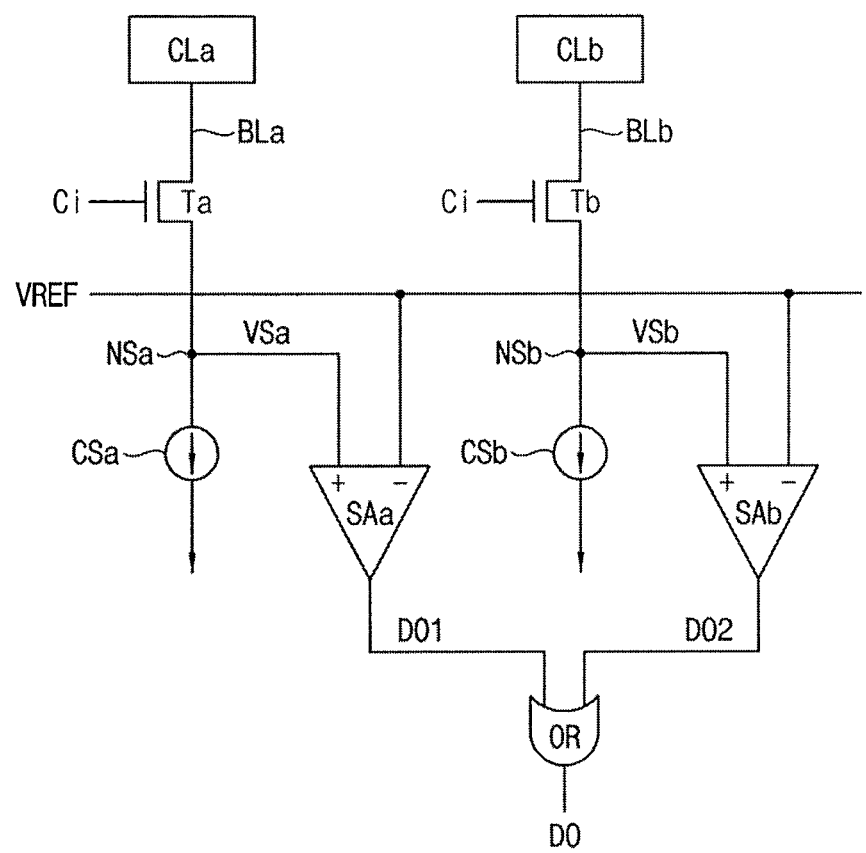
FIG. 20 illustrates another embodiment of a read method in an OTP memory device.
FIG. 21 illustrates another embodiment of a program scheme for a read method.
Figure 22:
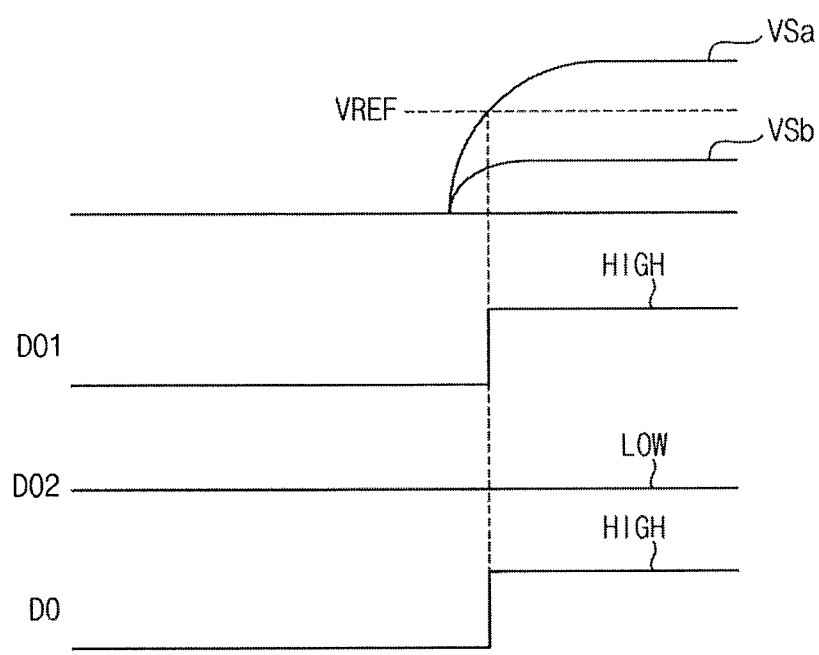
FIG. 22 illustrates another embodiment of data sensing in a read method.

FIG. 20 illustrates another embodiment of a read method in an OTP memory device. FIG. 21 illustrates an embodiment of a program scheme corresponding to the read method of FIG. 20. FIG. 22 illustrates an embodiment for data sensing in the read method of FIG. 20.

Referring to FIG. 20, each of OTP memory cells CLa and CLb may store a single data bit. A single output bit D0 may be generated based on the data bits stored in the OTP memory cells CLa and CLb. When a column selection signal Ci is activated, column selection switches Ta and Tb are turned on and the OTP memory cells CLa and CLb to be read out may be electrically connected to sensing nodes NSa and NSb through bitlines BLa and BLb. Current sources CSa and CSb may be connected to the sensing nodes NSa and NSb for a current sensing scheme. Sense amplifiers SAa and SAb may compare sensing voltages VSa and VSb at the sensing nodes NSa and NSb with a reference voltage VREF to generate the two data bits D01 and D02, respectively. An OR logic gate may perform an OR logic operation on the two data bits D01 and D02 to generate the output bit D0.

Referring to FIG. 21, each bit of the voltage trim code TRM is generated based on values stored in the OTP memory cells CLa and CLb that are programmed by the same value. For example, the first OTP memory cell CLa and the second OTP memory cell CLb may be programmed when the data bit corresponds to a logical 1. The first OTP memory cell CLa and the second OTP memory cell CLb may be unprogrammed when the data bit corresponds to a logical 0.

Referring to FIG. 22, the output bit D0 may be read out as the logic high level when the first OTP memory cell CLa and the second OTP memory cell CLb are on-cells. FIG. 22 illustrates the sensing voltage VSa at the first sensing node Na when the first OTP memory cell CLa is a normal cell and the sensing voltage VSb at the second sensing node Nb when the second OTP memory cell CLb is a defective cell or a weak cell. In this case, the data bit D01 may be read out normally as the logic high level and the data bit D02 may be distorted as the logic low level. However, the result of the OR logic operation of the data bits D01 and D02 is provided as the output bit D0. The output bit D0 may be read out normally as the logic high level even though one of the OTP memory cells CLa or CLb is a weak cell.

In the example embodiments of FIGS. 20, 21, and 22, each output bit is generated based on the values of two OTP memory cells programmed by the same value. In one embodiment, each output bit may be generated based on the values of a different number of (e.g., three or more) OTP memory cells programmed by the same value.

As a result, the reliability of the fuse bits and the performance of the OTP memory device may be enhanced by providing each fuse bit based on the values stored in the multiple OTP memory cells.

Figure 23:
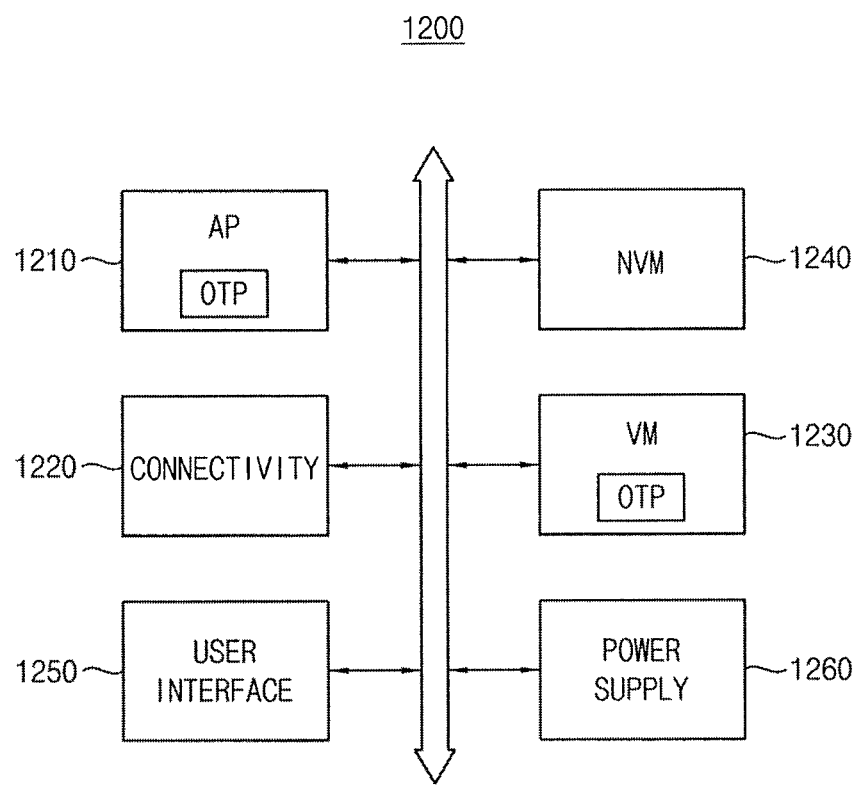
FIG. 23 illustrates an embodiment of a mobile system.

FIG. 23 illustrates an embodiment of a mobile system 1200 including an OTP memory device according to any of the aforementioned example embodiments.

Referring to FIG. 23, the mobile system 1200 includes an application processor 1210, a connectivity unit 1220, a volatile memory device (VM) 1230, a nonvolatile memory device 1240, a user interface 1250, and a power supply 1260. The application processor 1210 may execute applications such as a web browser, a game application, a video player, etc. The connectivity unit 1220 may perform wired or wireless communication with an external device. The volatile memory device 1230 may store data processed by the application processor 1210, or may operate as a working memory.

The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200. In some embodiments, the mobile system 1200 may further include a camera image processor (CIS), and/or a storage device, such as a memory card, a solid state drive (SSD), a hard disk drive (HDD), a CD-ROM, etc.

The application processor 1210 and/or the volatile memory device 1230 may include an OTP memory device. As described above, the OTP memory device may include a latch controller and a latch circuit for providing a number of fuse bits greater than the number of input-output lines.

The aforementioned embodiments of the OTP memory device for storing non-volatile data may be applied to various devices and systems. Examples include but are not limited to a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

In accordance with one embodiment, an apparatus includes a controller to generate a control signal for a one-time programmable (OTP) memory device; first logic to electrically connect bitline groups to input-output lines based on the control signal; and second logic to store a number of fuse bits to be sequentially provided through the bitline groups and the input-output lines, wherein the number of fuse bits is greater than a number of the input-output lines. The control signal may be a latch address signal indicating an address that is to be changed sequentially in an enable mode to initialize the OTP memory device. The first logic may electrically connect the bitline groups to the input-output lines sequentially based on the latch address signal. The controller may generate the latch address signal based on a reset signal to read the fuse bits. The controller may change an address indicated by the latch address signal when the reset signal is activated, or change the address indicated by the latch address signal by a designation number of times. The controller may correspond, for example, to the latch controller, the first logic may correspond, for example, to the column selection circuit, and the second logic may correspond, for example, to the latch circuit of the aforementioned embodiments or may be different from those features. In another embodiment, the controller, first logic, and/or second logic may be different from the latch controller, column selection circuit, and latch circuit of the aforementioned embodiments.

In accordance with one or more of the aforementioned embodiments, the performance of an OTP memory device may be enhanced by providing a greater number of fuse bits than the number of input-output lines. This may be accomplished, for example, through the sequential selection of bitline groups and a latch circuit in the enable mode. In addition, the reliability of the fuse bits and performance of the OTP memory device may be enhanced by providing each fuse bit based on values stored in the multiple OTP memory cells.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, blocks, units, and other signal generating and processing features of the embodiments disclosed herein may be implemented in logic which, for example, may include hardware, software, or both. When implemented at least partially in hardware, the controllers, blocks, units, and other signal generating and processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers and other signal generating, blocks, units, and processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A one-time programmable (OTP) memory device, comprising:
    an OTP cell array including a plurality of OTP memory cells respectively connected to a plurality of bitlines;
    a latch controller to generate a latch address signal indicating an address that is changed sequentially in an enable mode to initialize the OTP memory device;
    a column selection circuit to electrically connect a plurality of bitline groups of the bitlines to a plurality of input-output lines sequentially based on the latch address signal in the enable mode; and
    a latch circuit to receive and store fuse bits provided sequentially through the bitline groups and the input-output lines in the enable mode, wherein the column selection circuit includes:
    a multiplexer to select and output the latch address signal in the enable mode and to select and output a column address signal from an external device in a normal operation mode after the enable mode; and
    a column decoder to generate column selection signals to select one of the bitline groups based on an output of the multiplexer.

2. The OTP memory device as claimed in claim 1, wherein:
    the latch controller is to generate the latch address signal based on a reset signal to read the fuse bits, and
    the latch controller is to change the address indicated by the latch address signal when the reset signal is activated or change the address indicated by the latch address signal by a designation number of times.

3. The OTP memory device as claimed in claim 2, wherein a bit number of the fuse bits stored in the latch circuit is to be determined based on an activation number of the reset signal or the designation number.

4. The OTP memory device as claimed in claim 1, wherein the latch controller is to generate the latch address signal internally regardless of an address signal from the external device.

5. The OTP memory device as claimed in claim 1, wherein:
    a number of the input-output lines is M and a number of the bitline groups electrically connected to the input-output lines sequentially is N, where N is a natural number greater than 1 and M is a natural number greater than 1, and
    the latch circuit stored N*M bits of the fuse bits.

6. The OTP memory device as claimed in claim 1, wherein:
    the latch controller is to generate a plurality of latch selection signals that are activated sequentially in the enable mode, and
    the latch circuit is to store the fuse bits sequentially based on the latch selection signals.

7. The OTP memory device as claimed in claim 6, wherein the latch circuit includes a plurality of latches to receive the latch selection signals respectively and to be enabled sequentially based on the latch selection signals.

8. The OTP memory device as claimed in claim 1, wherein the OTP cell array includes:
    a fuse block to store the fuse bits read out in the enable mode; and
    a normal block to store normal bits read out in the normal operation mode after the enable mode.

9. The OTP memory device as claimed in claim 1, further comprising:
    a voltage generator to generate an internal voltage based on a voltage trim code.

10. The OTP memory device as claimed in claim 9, wherein each bit of the voltage trim code is to be generated based on values stored in two or more OTP memory cells.

11. The OTP memory device as claimed in claim 10, wherein each bit of the voltage trim code is to be generated based on values stored in the two OTP memory cells that are programmed by complementary values.

12. The OTP memory device as claimed in claim 10, wherein each bit of the voltage trim code is to be generated based on values stored in the two or more OTP memory cells that are programmed by a same value.

13. The OTP memory device as claimed in claim 9, wherein the voltage trim code is to be provided from the latch circuit.

14. A one-time programmable (OTP) memory device, comprising:
    an OTP cell array including a plurality of OTP memory cells respectively connected to a plurality of bitlines;
    a latch controller to generate a latch address signal indicating an address that is changed sequentially regardless of an external address signal in an enable mode to initialize the OTP memory device and to generate a plurality of latch selection signals that are enabled sequentially;
    a column selection circuit to electrically connect N bitline groups of the bitlines to M input-output lines sequentially in the enable mode based on the latch address signal, where N is a natural number greater than 1 and M is a natural number greater than 1; and
    a latch circuit to receive and store N*M fuse bits that are provided sequentially through the N bitline groups and the M input-output lines in the enable mode based on the latch selection signals, wherein the column selection circuit includes:
    a multiplexer to select and output the latch address signal in the enable mode and to select and output a column address signal from an external device in a normal operation mode after the enable mode; and
    a column decoder to generate column selection signals to select one of the N bitline groups based on an output of the multiplexer.

15. An apparatus, comprising:
a controller to generate a latch address signal for a one-time programmable (OTP) memory device, the latch address signal indicating an address that is changed sequentially in an enable mode to initialize the OTP memory device;
first logic to electrically connect bitline groups to input-output lines sequentially based on the latch address signal in the enable mode; and
second logic to store a number of fuse bits to be sequentially provided through the bitline groups and the input-output lines, wherein the number of fuse bits is greater than a number of the input-output lines, wherein the first logic includes:
a multiplexer to select and output the latch address signal in the enable mode and to select and output a column address signal from an external device in a normal operation mode after the enable mode; and
a column decoder to generate column selection signals to select one of the bitline groups based on an output of the multiplexer.

16. The apparatus as claimed in claim 15, wherein the first logic is to electrically connect the bitline groups to the input-output lines sequentially based on the latch address signal.

17. The apparatus as claimed in claim 15, wherein the controller is to generate the latch address signal based on a reset signal to read the fuse bits.

18. The apparatus as claimed in claim 17, wherein the controller is to:
change an address indicated by the latch address signal when the reset signal is activated, or
change the address indicated by the latch address signal by a designation number of times.

* * * * *